(12) United States Patent
Lee et al.

(10) Patent No.: US 9,510,461 B2
(45) Date of Patent: Nov. 29, 2016

(54) ELECTRIC COMPONENT MODULE AND METHOD OF MANUFACTURING THE SAME

(71) Applicant: SAMSUNG ELECTRO-MECHANICS CO., LTD., Suwon, Gyunggi-do (KR)

(72) Inventors: Il Hyeong Lee, Gyunggi-do (KR); Jae Cheon Doh, Gyunggi-do (KR); Seung Yong Choi, Gyunggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 355 days.

(21) Appl. No.: 14/047,552

(22) Filed: Oct. 7, 2013

(65) Prior Publication Data

US 2014/0376193 A1     Dec. 25, 2014

(30) Foreign Application Priority Data

Jun. 24, 2013    (KR) ........................ 10-2013-0072691

(51) Int. Cl.
| | |
|---|---|
| *H05K 1/14* | (2006.01) |
| *H05K 3/36* | (2006.01) |
| *H01L 23/00* | (2006.01) |
| *H05K 1/02* | (2006.01) |
| *H05K 1/18* | (2006.01) |
| *H05K 3/28* | (2006.01) |

(52) U.S. Cl.
CPC .............. *H05K 3/368* (2013.01); *H01L 24/97* (2013.01); *H05K 1/144* (2013.01); *H01L 2224/16225* (2013.01); *H01L 2924/181* (2013.01); *H01L 2924/19105* (2013.01); *H01L 2924/19106* (2013.01); *H05K 1/0298* (2013.01); *H05K 1/181* (2013.01); *H05K 3/284* (2013.01); *H05K 2201/042* (2013.01);

(Continued)

(58) Field of Classification Search
CPC ............ H05K 1/14; H05K 3/30; H05K 1/18; H05K 1/144; H05K 1/181
USPC ..................... 361/784, 736; 29/832
See application file for complete search history.

(56) References Cited

U.S. PATENT DOCUMENTS

| | | | | |
|---|---|---|---|---|
| 6,555,756 B2 * | 4/2003 | Nakamura | ............ | H01L 23/057 174/255 |
| 6,574,116 B2 * | 6/2003 | Moriwaki | ............. | H02M 7/003 174/262 |

(Continued)

FOREIGN PATENT DOCUMENTS

| | | |
|---|---|---|
| CN | 202394957 U | 8/2012 |
| KR | 10-2009-0026631 A | 3/2009 |
| KR | 10-2013-0056570 A | 5/2013 |

OTHER PUBLICATIONS

Korean Office Action dated Nov. 12, 2014 in Korean Patent Application No. 10-2013-0072691 (English translation).

(Continued)

*Primary Examiner* — Dion R Ferguson
*Assistant Examiner* — Mandeep S Buttar
(74) *Attorney, Agent, or Firm* — NSIP Law

(57) ABSTRACT

There is provided an electronic component module capable of increasing a degree of integration by mounting electronic component on both surfaces of a substrate, the module including: a first substrate having mounted electrodes formed on both surfaces thereof; a plurality of electronic components mounted on both surfaces of the first substrate; at least one second substrate bonded to a lower surface of the first substrate; and an insulating part formed in at least one position in a gap between the first substrate and the second substrate and bonding the first substrate to the second bonding substrate.

14 Claims, 10 Drawing Sheets

(52) U.S. Cl.
CPC .............. *H05K 2201/09063* (2013.01); *H05K 2203/1316* (2013.01); *Y10T 29/49126* (2015.01)

(56) References Cited

U.S. PATENT DOCUMENTS

| | | | |
|---|---|---|---|
| 2002/0041026 A1* | 4/2002 | Ball | H01L 23/4951 257/734 |
| 2002/0113304 A1* | 8/2002 | Doh | H01L 21/568 257/686 |
| 2004/0134976 A1* | 7/2004 | Keyser | B23K 35/0244 228/248.1 |
| 2006/0220210 A1 | 10/2006 | Karnezos et al. | |
| 2013/0127025 A1 | 5/2013 | Cho | |

OTHER PUBLICATIONS

Chinese Office Action issued on Jun. 30, 2016 in counterpart Chinese Patent Application No. 201310513577.8 (11 pages in English; 8 pages in Chinese).

* cited by examiner

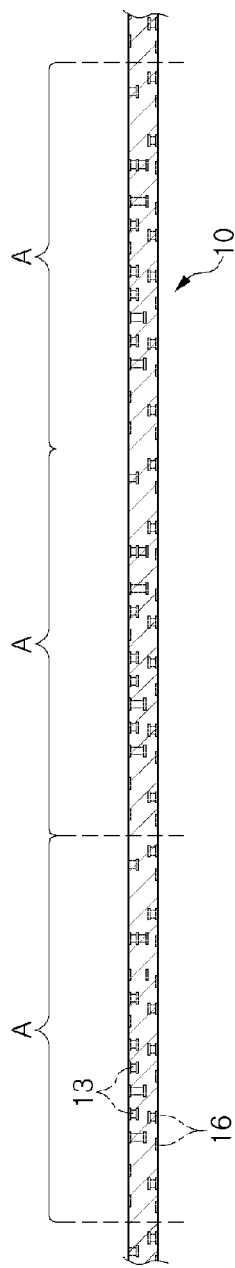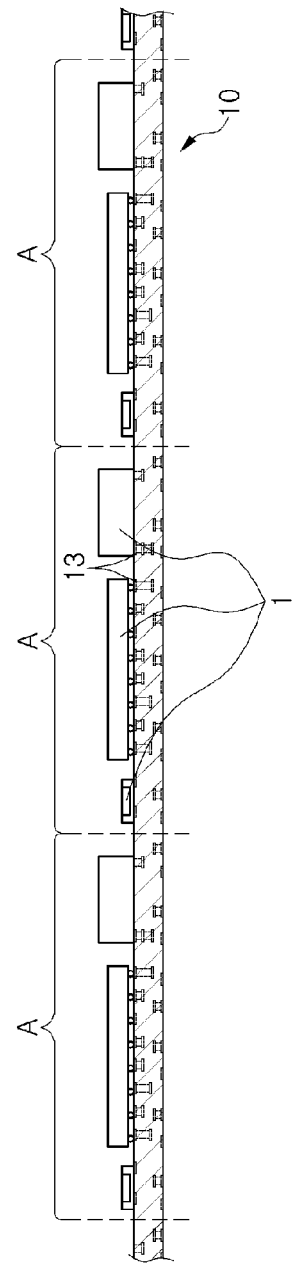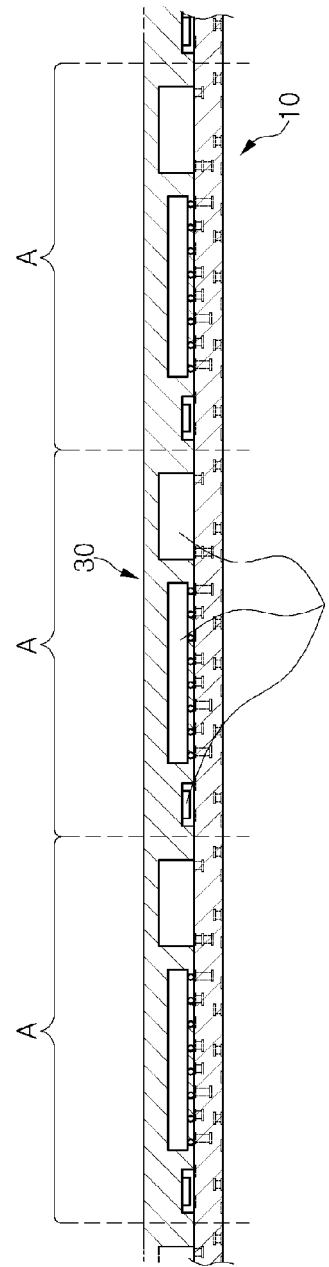

ELECTRIC COMPONENT MODULE AND METHOD OF MANUFACTURING THE SAME

CROSS-REFERENCE TO RELATED APPLICATIONS

This application claims the priority of Korean Patent Application No. 10-2013-0072691 filed on Jun. 24, 2013, in the Korean Intellectual Property Office, the disclosure of which is incorporated herein by reference.

BACKGROUND OF THE INVENTION

Field of the Invention

The present invention relates to an electronic component module and a method of manufacturing the same, and more particularly, to an electronic component module capable of increasing a degree of integration by way of having electronic components mounted on both surfaces of a substrate and a method of manufacturing the same.

Description of the Related Art

Current demand for mobile devices is drastically increasing in electronic product markets, and accordingly, demands for smaller and lighter electronic components to be mounted in electronic products are continually being made.

In order to implement smaller and lighter electronic components, in addition to reducing the sizes of individual components to be mounted, system on chip (SOC) technology, allowing a plurality of individual elements to be implemented as a single chip, a system in package (SIP) technology which integrates a plurality of individual elements into one package, or the like are required.

Incidentally, in order to manufacture electronic component modules which are small but have high performance, a structure in which electronic components are mounted on both surfaces of a substrate is currently being developed, as disclosed in Korean Patent Laid-open Publication No. 2013-0056570, for example.

In the electronic component module disclosed in the Patent Document, electronic devices are mounted on both surfaces of the first substrate and the second substrate is mounted on the first substrate so as to be used as an external connection terminal. Further, an insulating portion is formed between the first and second substrates to ensure coupling strength and reliability.

In such electronic component modules, a liquid state insulating material is injected between the first and second substrates to form the insulating portion, during which it is necessary to block the flow of the insulating material in order to prevent the insulating material from spreading out excessively.

Previously, a separate feature has been added to a substrate for blocking the flow of an insulating material, such that the manufacturing process becomes complicated. In addition, an overall manufacturing process may be elongated.

Therefore, a double-sided electronic component module capable of forming an insulating portion more easily, and a method of manufacturing the same are required.

RELATED ART DOCUMENT (Patent Document 1) Korean Patent Laid-open Publication No. 2013-0056570

SUMMARY OF THE INVENTION

An aspect of the present invention provides a double-sided electronic component module capable of having electronic components mounted on both surface of a substrate.

According to an aspect of the present invention, there is provided an electronic component module, including: a first substrate having mounted electrodes formed on both surfaces thereof; a plurality of electronic components mounted on both surfaces of the first substrate; at least one second substrate bonded to a lower surface of the first substrate; and an insulating part formed in at least one position in a gap between the first substrate and the second substrate and bonding the first substrate to the second bonding substrate.

The insulating part may be formed along an outer edge of the gap.

The insulating part may be formed by melting and curing an insulating member.

The insulating member may be one of hot-melt tape, thermal bonding tape and thermosetting bonding tape.

The insulating part may be formed in a dashed-line shape in which multiple pieces are spaced apart.

The insulating part may further include a secondary insulating part formed at the gap between the first substrate and the second substrate, for extending the insulating part.

The second substrate may have a through hole therein, wherein the electronic components may be located in the through hole.

The insulating part may be formed along an outer edge of the through hole.

The electronic component module may further include a secondary insulating part filling the gap between the first substrate and the second substrate and the through hole.

The second substrate may have a through hole therein, wherein the electronic components are located in the through hole, wherein the insulating part fills the through hole.

According to another aspect of the present invention, there is provided an electronic component module, including: a first substrate having mounted electrodes formed on both surfaces thereof; a plurality of electronic components mounted on both surfaces of the first substrate; at least one second substrate having at least one through hole and bonded to a lower surface of the first substrate; and an insulating part filling a gap between the first substrate and the second substrate and the through hole.

The insulating part may be formed by injecting and curing a liquid insulating material.

According to another aspect of the present invention, there is provided a method of manufacturing an electronic component module, the method including: preparing a first substrate having mounted electrodes formed on both surfaces thereof; mounting at least one electronic component on an upper surface of the first substrate; disposing a solder paste and an insulating member on a lower surface of the first substrate; locating at least one electronic component and at least one second substrate on the solder paste; and forming an insulating part in a gap between the first substrate and second substrate by melting and curing the insulating member.

The disposing of the insulating member may include: printing a solder paste on the mounting electrodes; and attaching the insulating member along the outer edge of the first substrate as a tape type insulating member.

The locating of the second substrate may include locating the second substrate such that one surface of the second substrate is in contact with the insulating member.

The method may further include, after the forming of the insulating part, forming a secondary insulating part by injecting a liquid insulating material into the gap.

The method may further include, after the forming of the insulating part, forming a secondary insulating part by filling an insulating material in the through hole formed in the second substrate.

According to another aspect of the present invention, there is provided a method of manufacturing an electronic component module, the method including: preparing a first substrate in which several component-mounting regions are divided; mounting at least one electronic component on an upper surface of the first substrate; disposing a solder paste and an insulating member on a lower surface of the first substrate; locating and mounting at least one electronic component and a second substrate on the solder paste; and forming an insulating part by injecting a liquid insulating material between the first substrate and second substrate.

The insulating member may be disposed in a dummy region outside of the component-mounting regions.

The forming of the insulating part may further include filling in the through hole formed in the second substrate with the insulating material.

BRIEF DESCRIPTION OF THE DRAWINGS

The above and other aspects, features and other advantages of the present invention will be more clearly understood from the following detailed description taken in conjunction with the accompanying drawings, in which:

FIGS. 4A to 4G are cross-sectional views for illustrating a method of manufacturing the electronic component module according to the embodiment;

DETAILED DESCRIPTION OF THE INVENTION

Figure 1:
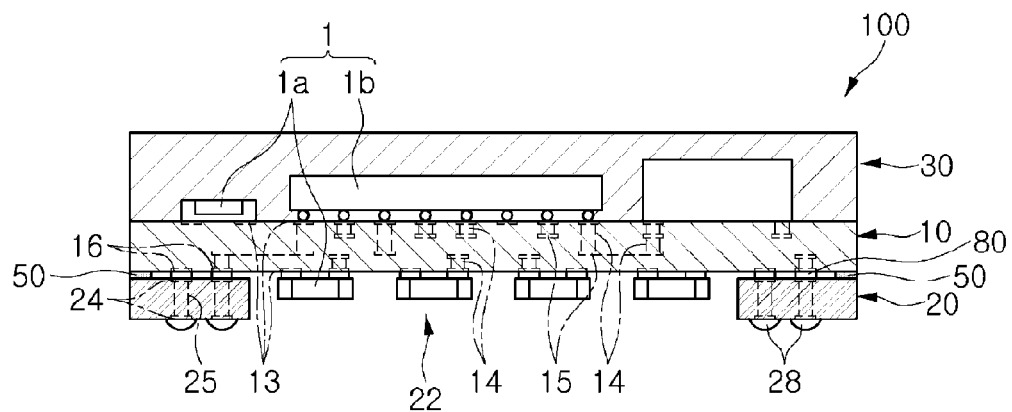
FIG. 1 is a cross-sectional view schematically illustrating an electronic component module according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

FIG. 1 is a cross-sectional view schematically illustrating an electronic component module according to an embodiment of the present invention. In addition, FIG. 2 is a partially cutaway perspective view illustrating the inside of the electronic component module shown in FIG. 1; and FIG. 3 is an exploded perspective view of the electronic component module shown in FIG. 1.

Figure 2:
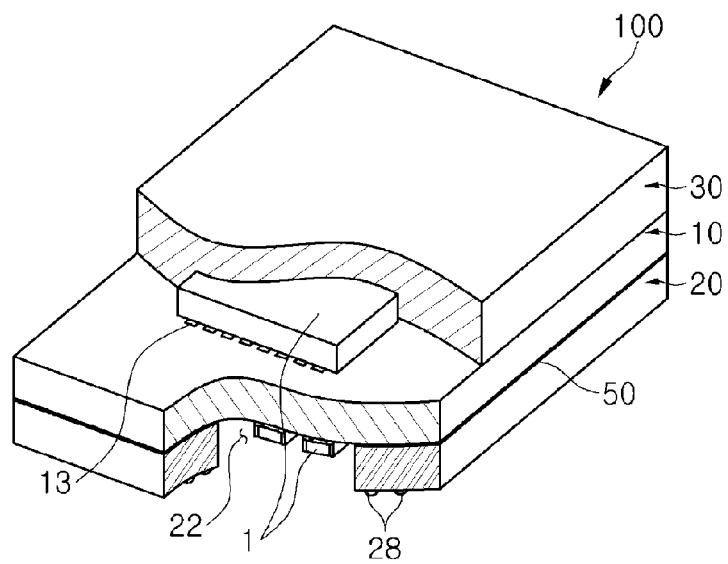
FIG. 2 is a partially cutaway perspective view illustrating the inside of the electronic component module shown in FIG. 1.
Figure 3:
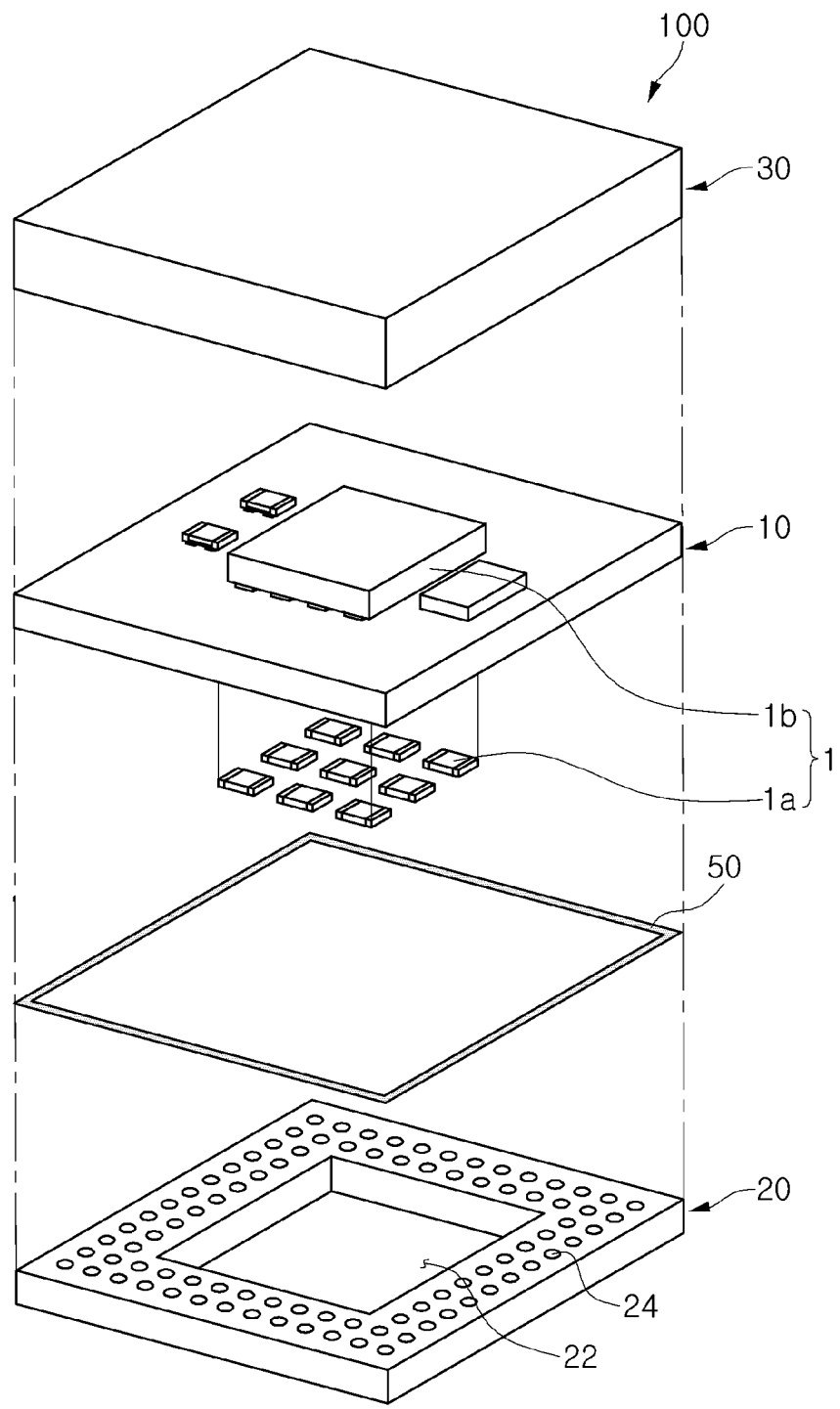
FIG. 3 is an exploded perspective view of the electronic component module shown in FIG. 1.

Referring to FIGS. 1 to 3, the electronic component module 100 according to the embodiment may include an electronic component 1, a first substrate 10, a second substrate 20 and a molded part 30.

The electronic component 1 includes various elements such as a passive component 1a and an active component 1b, and any element may be used as long as it can be mounted on a substrate.

The electronic component 1 may be mounted on both of upper and lower surfaces of the first substrate 10 to be described below.

The first substrate 10 has at least one electronic component 1 on each of the surfaces. As the first substrate 10, various kinds of known substrates (for example, a ceramic substrate, a printed circuit board, a flexible substrate, or the like) may be used. Further, on the surfaces of the first substrate 10, mounting electrodes 13 for mounting the electronic component 1 thereon or wiring patterns (not shown) for electrically connecting the mounting electrodes 13 may be formed.

The first substrate 10 may be a multilayer substrate consisting of a plurality of layers, and circuit patterns 15 for creating electrical connections may be formed between the layers.

In addition, the first substrate 10 according to the embodiment may include the mounting electrodes 13 formed on both of the surfaces, and conductive vias 14 electrically connecting circuit patterns 15 formed in the first substrate 10.

In addition, the substrate 10 according to the embodiment may include cavities (not shown) formed therein, to have the electronic components 1 to be mounted in the first substrate 10.

Moreover, the first substrate 10 according to the embodiment may have external connection pads 16 on the lower surface thereof. The external connection pads 16 are to be electrically connected to the second substrate 20 to be described below, and connected to external connection terminals 28 through the second substrate 20.

Accordingly, the external connection pads 16 may be formed in positions on the lower surface of the first substrate 10 which face the upper surface of the second substrate 20 when the first and second substrate 10 and 20 are coupled to each other. The number of the external connection pads 16 may vary as necessary.

In the embodiment, the first substrate 10 may have several identical mounting regions repeatedly disposed thereon for manufacturing a plurality of modules simultaneously, and may specifically have a quadrangular shape with a wide area or a long strip shape. In this case, electronic components may be manufactured per mounting region.

At least one second substrate 20 is coupled below the first substrate 10 and is electrically connected to the first substrate 10 by solder bonding parts 80.

Like the first substrate 10, the second substrate 20 may include various kinds of known substrates (for example, a ceramic substrate, a printed circuit board, a flexible substrate, or the like).

In addition, the second substrate 20 may be formed in such a manner that a plurality of insulating layers having vias are prepared and the insulating layers are stacked such that the vias are electrically connected with one another. Alternately, the second substrate 20 may be formed in such a manner that insulating layers are stacked on one another, through holes which penetrating all of the insulating layers are formed, and then vias are formed in the through holes. Additionally, the second substrate 20 may be formed in a variety of manners, for example, in a manner that one resin layer (e.g., an epoxy) is prepared, and metal posts (e.g., Cu posts) are embedded in the resin layer while penetrating it.

The second substrate 20 may have electrode pads 24 on both surfaces. The electrode pads 24 formed on the upper surface of the second substrate 20 are provided for being electrically connected to the external connection pads 16 of the first substrate 10. Further, the electrode pads 24 formed on the lower surface are provided so that the external connection terminals 28 are fastened thereto. Although not shown, wiring patterns may be formed on both surfaces of the second substrate 20 so as to electrically connect the electrode pads 24 to one another.

The second substrate 20 according to the embodiment may be a multilayer substrate consisting of a plurality of layers, and circuit patterns (not shown) for creating electrical connections may be formed between the layers.

In addition, the second substrate 20 may include the electrode pads 24 formed on both surfaces, and conductive vias 25 electrically connecting circuit patterns formed in the second substrate 20.

Further, the second substrate 20 according to the embodiment may have a thickness higher than the mounting height of the electronic components 1 mounted on the lower surface of the first substrate 10 in order to safely protect the electronic components 1 received in a through hole 22. However, the present invention is not limited thereto but the lower surface of the second substrate 20 may be disposed such that the lower surface of the second substrate 20 is on the same plane with one surface of the electronic component 1 mounted on the lower surface of the first substrate 10.

External connection terminals 28 are formed on the lower surfaces of the second substrate 20. The external connection terminals 28 electrically and mechanically connect the electronic component module 100 to a main substrate (not shown) on which the electronic component module 100 is mounted.

The external connection terminals 28 may be formed on the electrode pads 24 formed on the lower surface of the second substrate 20. The external connection terminals 28 may have a bump shape but are not limited thereto and may be formed in a variety of shapes such as a solder ball.

In addition, the external connection terminals 28 are electrically connected to the electrode pads 24 formed on the upper surface by vias 25 and the like. Accordingly, if the second substrate 20 is coupled to the first substrate 10, the first substrate 10 is electrically connected to the external connection terminals 28 via the second substrate 20.

Incidentally, as described above, if the first substrate 10 according to the embodiment has several separate module mounting regions, the second substrate 20 may be provided as a plurality of substrates individually attached to the separate module mounting regions formed on the first substrate 10. That is, the second substrate 20 may be prepared as several identical substrates and repeatedly disposed on the separate module mounting regions of the first substrate 10. Here, the second substrates 20 may be located on the first substrate 10 with a predetermined distance therebetween.

In the case that one first substrate 10 and several second substrates 20 are provided as described above, the electronic component modules 100 may be individualized by cutting the first substrate 10 according to the separate module mounting regions during the manufacturing process.

The molded part 30 is formed on upper surface of the first substrate 10 and seals the electronic components 1 mounted on the upper surface of the first substrate 10.

The molded part 30 fills between the electronic components 1 mounted on the first substrate 10, so that short-circuits between the electronic components 1 are prevented. In addition, the molded part 30 encloses the electronic components 1 and fastens the electronic components 1 on the substrate to safely protect them from external impacts.

The molded part 30 may be formed of insulating material including a resin material such as an epoxy. Further, the molded part 30 according to the embodiment may be formed by placing the first substrate 10 having the electronic components 1 mounted on the upper surface in a mold (not shown) and injecting a molding resin into the mold. However, the present invention is not limited thereto.

Further, the electronic component module 100 according to the embodiment may have an insulating part 50 interposed between the first and second substrates 10 and 20. The insulating part 50 is formed of an insulating material and is partially formed gaps between the first and second substrates 10 and 20 to bond them to each other.

In the embodiment, the insulating part 50 is not in contact with a conductive member 80 (e.g., a bump or a soldered joint) that electrically connects the first and second substrates 10 and 20. The method to form such configuration will be described below with respect to the method of manufacturing the electronic components module.

The insulating part 50 insulating one of the first and second substrates 10 and 20 from the other while enhances bonding between the first and second substrates 10 and 20 to increase bonding reliability.

The insulating part 50 may be formed through the insulating member according to the embodiment. The insulating member may include hot-melt tape, thermal bonding tape, thermosetting bonding tape and an adhesive in the liquid state.

Therefore, the insulating part 50 may be formed of a thermosetting resin such as an epoxy resin. That is, the insulating part 50 according to the embodiment may be formed of an adhesive tape of an epoxy material.

In addition, one or more insulating part 50 may be formed a position where no conductive member 80 exist but the present invention is mot limited thereto.

Although the insulating part 50 is disposed along the edge between the first and second substrates 10 and 20 in FIG. 3, the present invention is not limited thereto but may be disposed at different locations between the first and second substrates 10 and 20.

The electronic component module 100 according to the embodiment has the electronic components 1 mounted on both surfaces of the first substrate 10. In addition, the external connection terminals 28 are formed by the second substrate 20 disposed on the lower surface of the first substrate 10.

Therefore, plural electronic components 1 may be mounted on one substrate (i.e., the first substrate), so that degree of integration may be increased. Further, the external connection terminals 28 of the first substrate 10 having the electronic components 1 mounted thereon are formed using the separate second substrate 20, it is easy to form the external connection terminals 28 even if both surfaces are molded.

Next, a method of manufacturing the electronic component module according to the embodiment will be described.

FIGS. 4A to 4G are cross-sectional views for illustrating a method of manufacturing the electronic component module according to the embodiment.

Initially, the first substrate 10 is prepared as shown in FIG. 4A. As described above, the first substrate 10 may be a multilayer substrate and may have mounting electrodes 13 on both surfaces. In addition, the external connection pads 16 may be formed on the lower surface.

In particular, the first substrate 10 thus prepared may have several identical mounting regions A repeatedly disposed thereon, and may have a quadrangular shape with wide area or a long strip shape.

The first substrate 10 is for manufacturing a plurality of modules simultaneously such that the first substrate 10 has several module mounting regions A are separated thereon. The electronic component modules may be manufactured in each of the several module mounting regions A.

Then, as shown in FIG. 4B, the electronic components 1 are mounted on one surface, i.e., the upper surface of the first substrate 10. This may be performed by printing solder paste on the mounting electrodes 13 formed on one surface of the first substrate 10 in a screen printing method, for example, locating the electronic components 1 thereon, and then curing the solder paste with heat.

Here, for each of the module mounting regions A, identical electronic components 1 may be mounted in identical arrangement.

Subsequently, as shown in FIG. 4C, the electronic components 1 are sealed and the molded part 30 is formed on one surface of the first substrate 10. As described above, the first substrate 10 having the electronic components 1 thereon is disposed in the mold, and then molding resin is injected into the mold. By forming the molded part 30, the electronic components 1 mounted on one surface, i.e., the upper surface of the first substrate 10 may be protected from the outside by the molded part 30.

Incidentally, the molded part 30 according to the embodiment is one unit that covers all of the several module mounting regions A on the first substrate 10. However, the present invention is not limited thereto but the molded part 30 may be formed independently such that it is divided into pieces each corresponding to one of the module mounting regions A.

Figure 4D:
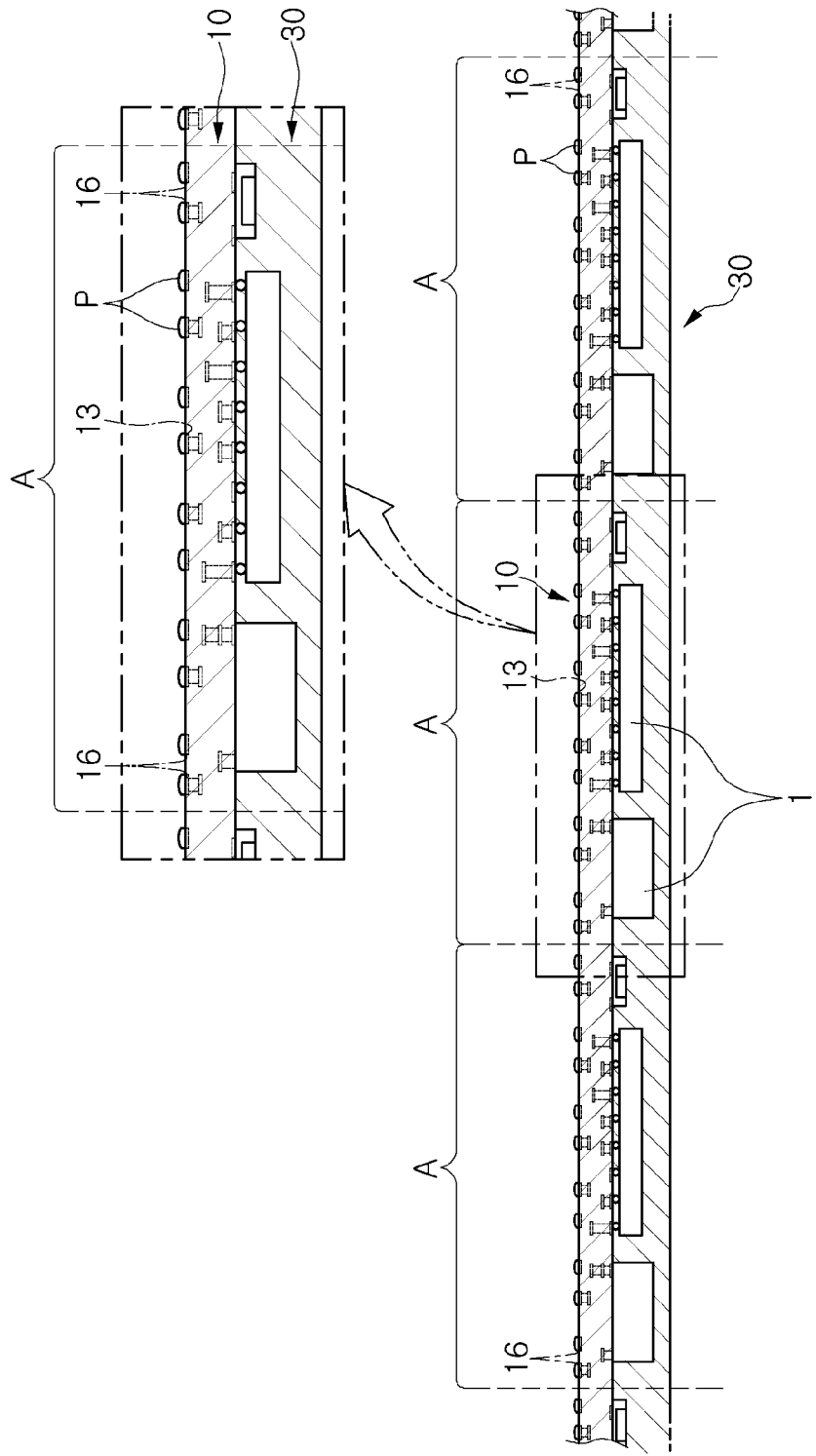

Then, as shown in FIG. 4D, solder paste P is printed on the other surface, i.e., the lower surface of the first substrate 10 on which the molded part 30 is formed. Here, the solder paste P is printed not only on the mounting electrodes 13 but also the external connection pads 16.

Figure 4E:
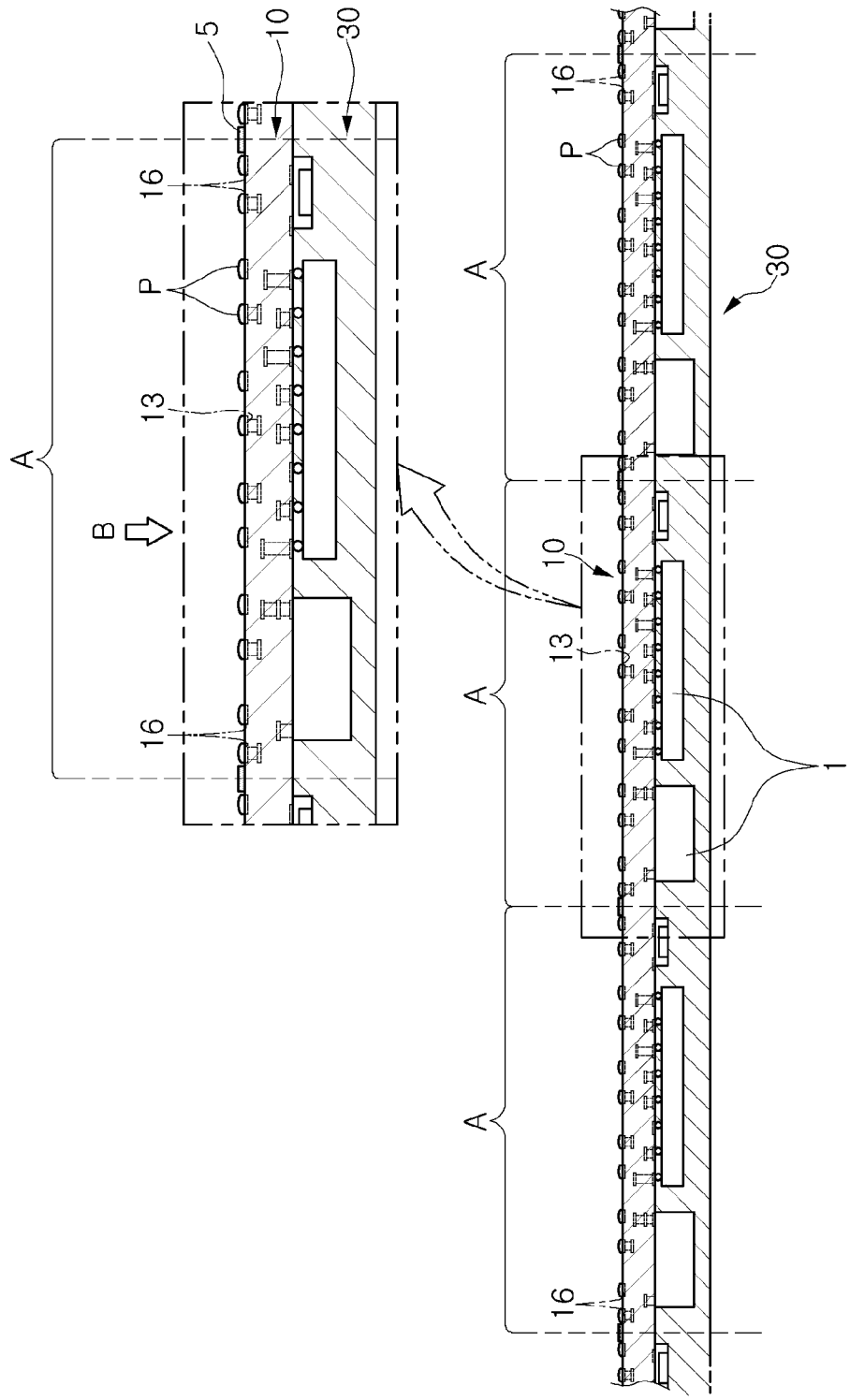

Then, as shown in FIG. 4E, the insulating member 5 is attached to one surface, i.e., the lower surface of the first substrate 10 on which the solder paste P is printed. The insulating member 5 is provided for forming the insulating part 50.

The insulating member 5 is melted by heating and then cured, to form the insulating part 50 according to the embodiment. Accordingly, the insulating member 5 may be a thermosetting bonding tape, more specifically an epoxy bonding tape. As described above, however, the insulating member is not limited thereto but may include hot-melt tape, thermal bonding tape and an adhesive in the liquid state.

The insulating member 5 may be bonded to the first substrate 10 such that either the entire insulating member 5 is included in the module mounting regions A or some of them is partially included in the module mounting regions A as shown in FIG. 4E. Further, the insulating member 5 may be disposed along the boundaries of the module mounting regions A. Therefore, the insulating member 5 may be bonded to the first substrate 10 conforming to the shape of the module mounting regions A in a grid shape.

Although the insulating member 5 is attached after the solder paste P is printed in the embodiment, the present invention is not limited thereto. That is, it may be variously modified as necessary. For example, various modifications to the insulating member 5 may be attached and then the solder paste P may be printed.

Figure 4F:
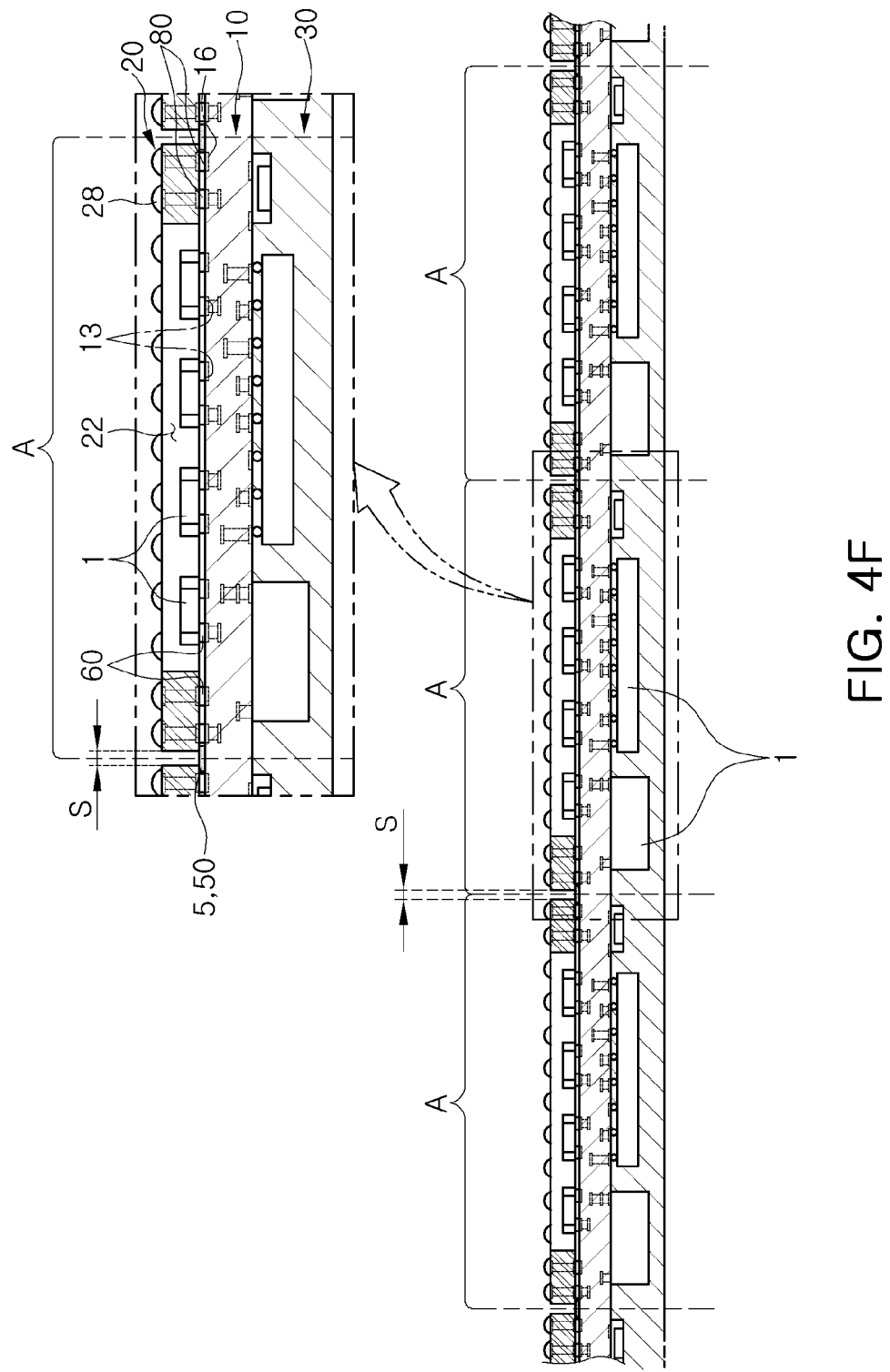

Then, as shown in FIG. 4F, the electronic components 1 and the second substrate 20 are mounted on the other surface of the first substrate 10 on which the solder paste P is printed.

To this end, initially, the electronic components 1 are located on the mounting electrodes 13 and the second substrate 20 are located on the external connection pads 16. In doing this, the electronic components 1 may be located first and then the second substrate 20 may be located. However, the present invention is not limited thereto but may be variously modified. For example, the second substrate 20 may be located first or the second substrate 20 and the electronic components 1 may be located simultaneously.

Unlike the first substrate 10 which is one substrate having several module mounting regions A, the second substrate 20 according to the embodiment may be plural substrates each individually attached to one of the module mounting regions A.

That is, the second substrate 20 may be prepared as several identical substrates and repeatedly disposed on the separate module mounting regions A of the first substrate 10. Here, the second substrates 20 may be located on the first substrate 10 with a predetermined distance S therebetween.

Further, the second substrate 20 is located on the first substrate 10 by making contact with the insulating member 5 attached to the first substrate 10. That is, each of the second substrate 20 makes surface contact with the insulating member 5 at the edge of the surface facing the first substrate 10.

Once the electronic components 1 and the second substrate 20 are located on the other surface of the first substrate 10, the solder paste (P in FIG. 4D) is cured with heat. As a result, the solder paste P is melted and cured, so that it is formed as the soldered joint 80 as shown in FIG. 4F. By the soldered joint 80, the electronic components 1 located on the lower surfaces of the first substrate 10 and the plural second substrates 20 are securely bonded to the first substrate 10, to be electrically and mechanically connected thereto.

Further, the insulating member 5 may also be melted and cured by the heat together with the solder paste P, and a part of the melted insulating member 5 permeates the gap between the first substrate 10 and the second substrate 20 to form the insulating part 50.

Figure 4G:
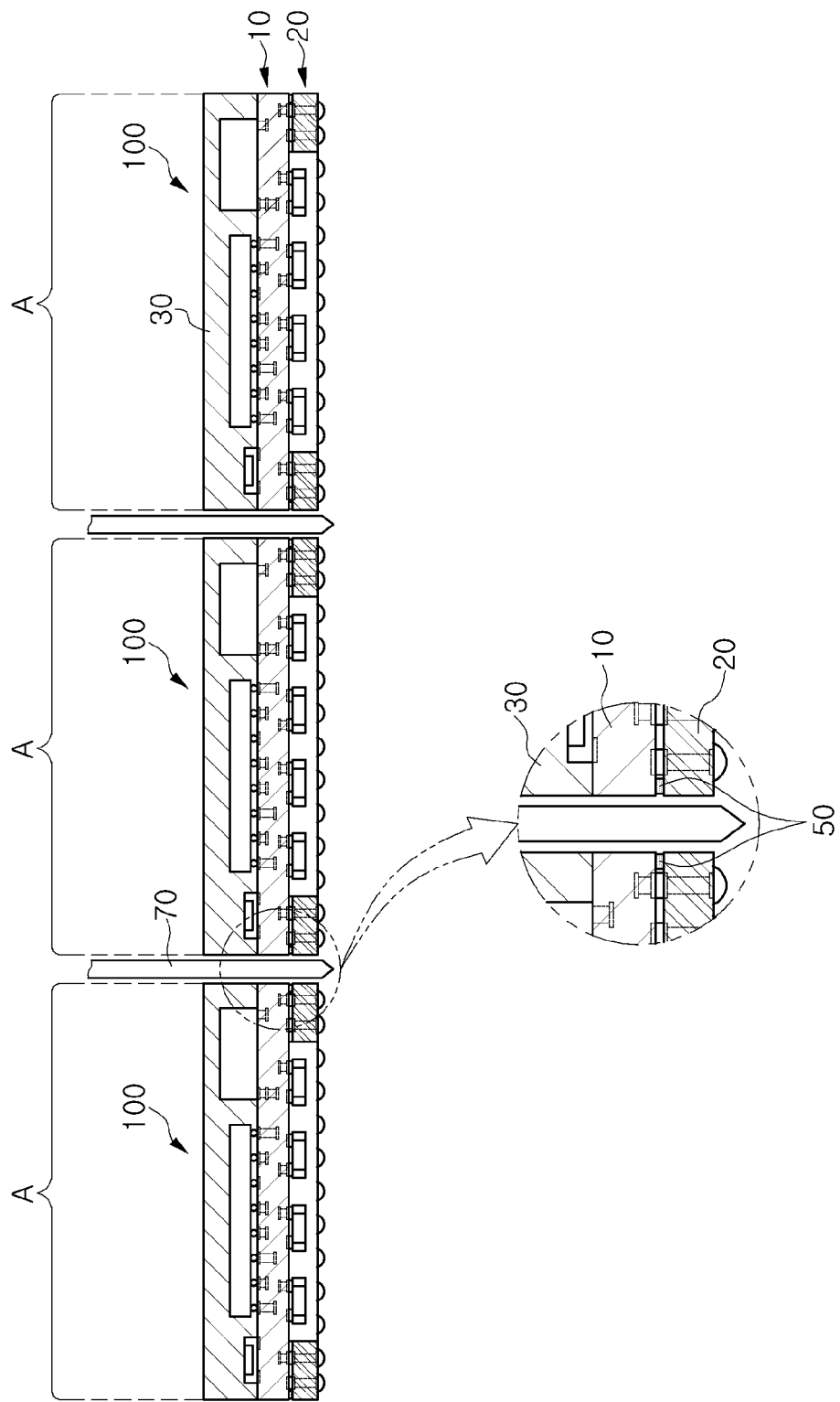

Finally, as shown in FIG. 4G, the first substrate 10 having the molded part 30 formed thereon is cut, so as to obtain individual electronic component modules 100.

This may be performed by cutting the first substrate 10 having the molded part 30 formed thereon along the boundaries of the module mounting regions (A in FIG. 4F) using a blade 70.

In the method of manufacturing the electronic component module according to the embodiment, the second substrates 20 are not cut by the blade 70 since the blade 70 moves along the space (S in FIG. 4F) between the second substrates 20.

Therefore, compared to the case that all of the first and second substrates 10 and 20 are cut, it is advantageous in that the cutting process is easier and time taken in the cutting process is reduced.

The electronic component module according the embodiment includes the second substrates and the electronic components (especially electronic components mounted on the lower surface of the first substrate) altogether. That is, the electronic components and the second substrates are disposed altogether on the lower surface of the first substrate, and bonded at the same time.

Therefore, compared to the scheme in which the electronic components and second substrates are separately bonded to the first substrate, the manufacturing process may be simpler and easier.

Further, the electronic component module according to the embodiment uses the insulating member which is a type of solid tape to form the insulating part. Therefore, any liquid insulating material used in the related art is not necessary, and thus a blocking part for blocking flow of the insulating material also may be omitted. Accordingly, a manufacturing process may be facilitated.

In addition, according to the method according to the embodiment, the insulating part is formed during the process of bonding the first substrate to the second substrate. Therefore, no additional process for forming the insulating part is required, and thus the processing time may be reduced.

The electronic component module and the method of manufacturing the same according to the embodiment of the present invention are not limited to the above-mentioned embodiment, but may be variously modified.

Figure 5:
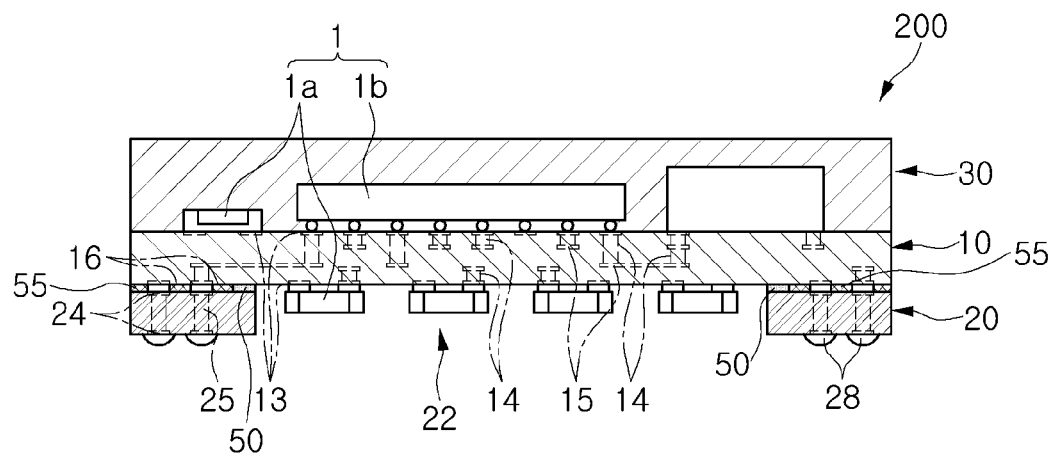
FIG. 5 is a cross-sectional view schematically illustrating an electronic component module according to another embodiment of the present invention.

FIG. 5 is a cross-sectional view schematically illustrating an electronic component module according to another embodiment of the present invention.

Referring to FIG. 5, the electronic component module 200 according to this embodiment has an insulating part 50 inner side of the first and second substrates 10 and 20 instead of outer edge. More specifically, the insulating part 50 according to this embodiment is formed around the opening of the through hole 22 along the shape of the through hole 22 formed on the second substrate 20.

In the case that the insulating part 50 is formed around the opening of the through hole 22 as described above, the insulating part 50 separates the gap between the first and second substrates 10 and 20 from the inner space of the through hole 22.

Further, the electronic component module 200 according to this embodiment may include a secondary insulating part 55.

The secondary insulating part 55 may be disposed between the first and second substrates 10 and 20 to extend from the insulating part 50, and may be formed by injecting a liquid insulating material into the gap after the insulating part 50 is formed to cure it.

In this case, since flow of the insulating material is blocked by the insulating part 50 already formed, the insulating material fills only the gap and does not flow into the inner area of the through hole 22 having the electronic components 1 mounted therein.

Figure 6:
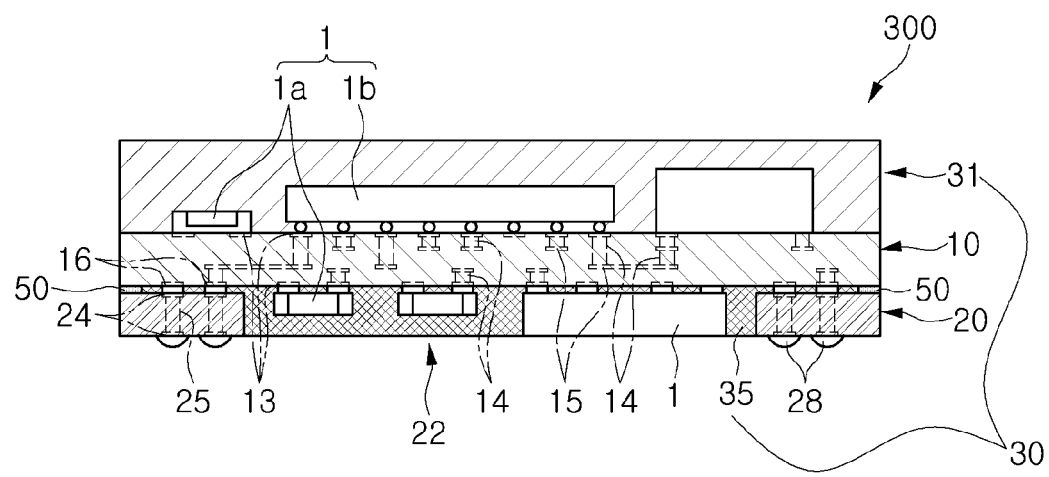
FIG. 6 is a cross-sectional view schematically illustrating an electronic component module according to another embodiment of the present invention.

FIG. 6 is a cross-sectional view schematically illustrating an electronic component module according to another embodiment of the present invention.

Referring to FIG. 6, the electronic component module 300 according to this embodiment has a molded part 35 at the inner area of the through hole. That is, in this embodiment, the molded part 30 may be divided into a first molded part 31 formed on the upper surface of the first substrate 10 and a second molded part 35 formed on the lower surface of the first substrate 10, i.e., in the through hole 22 of the second substrate.

The first molded part 31 may cover the entire of one surface of the first substrate 10. Further, although not shown, at least one of the electronic components 1 embedded in the first molded part 31 may be exposed to the outside of the first molded part 31.

The second molded part 35 may be formed in the through hole 22 of the second substrate 20. However, the present invention is not limited thereto but the second molded part 35 may be formed outside of the second substrate 20 depending on the shape of the second substrate 20.

The second molded part 35 according to this embodiment fill the entire of the inner area of the through hole 22. In addition, the second molded part 35 may have some of the electronic components 1 exposed to the outside. However, the present invention is not limited thereto but all of the electronic components 1 may be embedded in the second molded part 35.

The second molded part 35 may be formed by injecting a liquid insulating material into the through hole 22 to be filled after forming the insulating part 50 shown in FIG. 4 and curing the liquid insulating material. In this case, the liquid insulating material may not only fill the inner area of the through hole 22 but also the gap between the first substrate 10 and the second substrate 20. Accordingly, the second molded part 35 may be regarded as extended secondary part 55 shown in FIG. 5.

To this end, the insulating part 50 according to this embodiment is disposed along the outer edge of the first and second substrates 10 and 20 to securely block the gap therebetween. Therefore, it may prevent the insulating material from leaking through the gap even if the liquid insulating material fills the through hole 22.

Incidentally, the method of forming the second molded part 35 is not limited to injecting the insulating material described above but the second molded part 35 may be formed according to various methods as necessary. For example, the second molded part 35 may be formed by injecting a molding resin like the first molded part 31. In this case, the second molded part may be obtained such that the insulating part 50 is formed, the first and second substrates 10 and 20 having the insulating part 50 are disposed in a mold, and a molding resin is injected.

Figure 7:
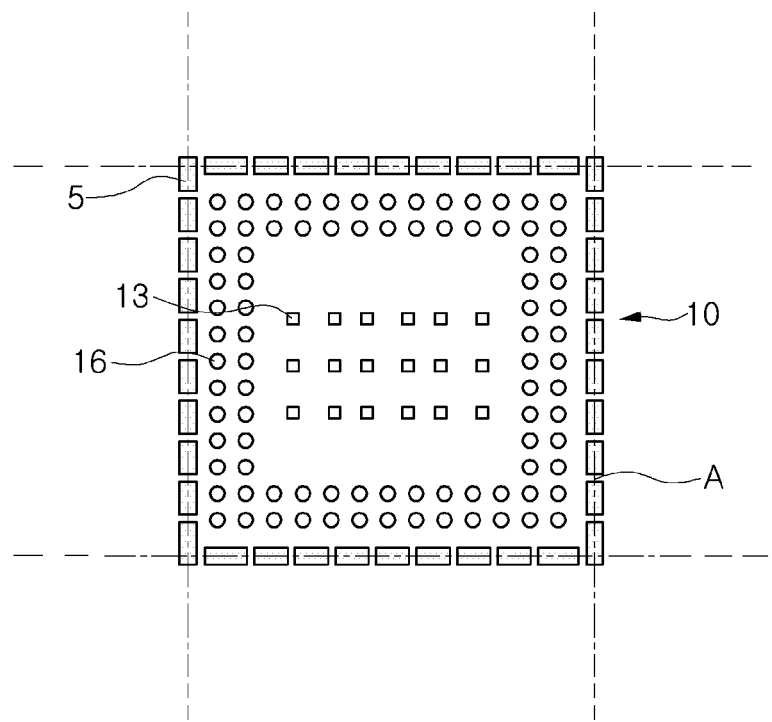
FIG. 7 is a view schematically illustrating an electronic component module according to another embodiment of the present invention.

FIG. 7 is a view for illustrating a method of manufacturing an electronic component module according to another embodiment of the present invention.

FIG. 7 is a plan view seen in direction B of FIG. 4E, in which insulating members 5 are not attached as a contiguous grid shape but are disposed as discrete pieces. Here, each of the insulating members 5 may be disposed in a dashed-line shape with a predetermined distance therebetween.

Even if the insulating members 5 are separated in a dashed-line shape, the insulating members 5 are melted and expanded to be connected to one another, so that eventually the insulating part 50 of one unit is formed.

Therefore, after all of the melted insulating members 5 are cured, the insulating part 50 may be formed as a solid single unit as shown in FIG. 3.

Figure 8:
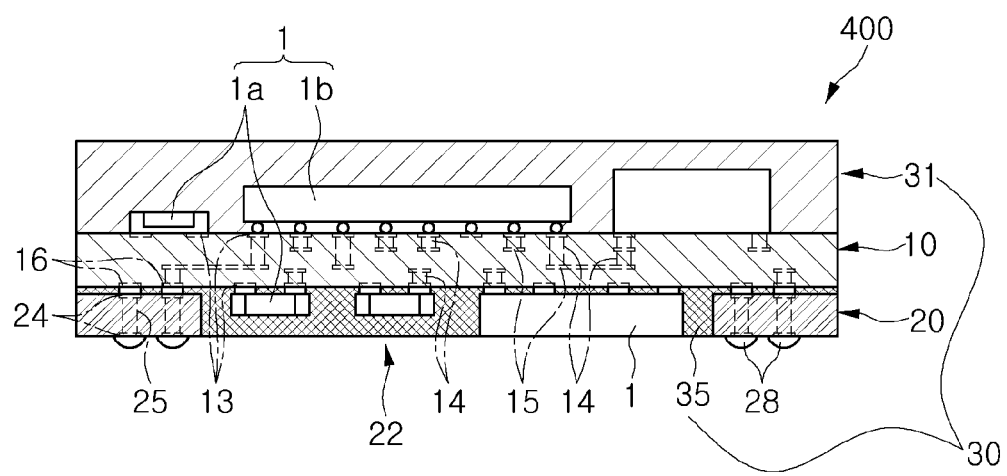
FIG. 8 is a cross-sectional view schematically illustrating an electronic component module according to another embodiment of the present invention.
Figure 9:
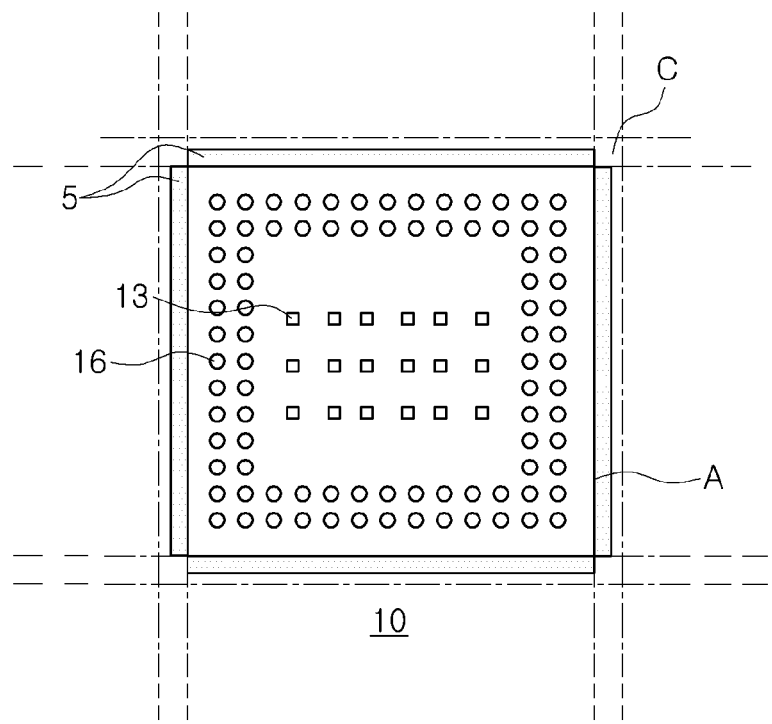
FIG. 9 is a view for illustrating a method of manufacturing the electronic component module shown in FIG. 8.

FIG. 8 is a cross-sectional view schematically illustrating an electronic component module according to another embodiment of the present invention, and FIG. 9 is a view for illustrating a method of manufacturing the electronic component module shown in FIG. 8. FIG. 9 shows the plane of the first substrate corresponding to that in FIG. 7.

Referring to FIG. 8, the electronic component module 100 according to this embodiment eliminates the insulating part 50 in the embodiment shown in FIG. 6. That is, this embodiment includes the second molded part 35 in FIG. 6 only.

This is because the insulating members 5 are not used as insulating part but as a dam. Referring to FIG. 9, in the method of manufacturing the electronic component module according to this embodiment, when the insulating members 5 are attached to the first substrate 10, the insulating members 5 are disposed outside of the boundaries of individual module 100 mounting regions. Therefore, the insulating members 5 may be attached to a dummy regions C disposed between the module mounting regions A of the first substrate 10.

With this configuration, when the second substrate 20 is mounted on the first substrate 10, the insulating members 5 are located outside of the second substrate 20 to serve as a dam to seal the gap between the first substrate 10 and the second substrate 20. Therefore, it may prevent the insulating material from leaking even if the liquid insulating material is injected into the through hole 22 or the gap.

Then, the first substrate 10 is cut so as to individualize the electronic component module 100, all of the insulating members 5 are cut and removed together with the dummy regions C of the first substrate, such that only the second molded part 35 obtained from the cured liquid insulating material remains as shown in FIG. 8.

The insulating members 5 according to the embodiments of the present invention may be directly used as the insulating part (50 in FIG. 6) and also may be used as means for forming the second molded part 35 or insulating part 50.

Although the embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

For example, although the insulating part is formed outside or inside of the gap in the embodiment, the present invention is not limited thereto. That is, the insulating parts may be formed outside and inside of the gap.

Further, although the insulating part is formed the entire of the outer or inner edge of the gap between the first and second substrates in the embodiment, the insulating part may be formed by attaching insulating members in the gap partially in places and so on.

As set forth above, according to the embodiments of the present invention, electronic components are mounted on both surfaces of a first substrate and external connection terminals are formed by second substrates disposed on the lower surface of the first substrate, so that a plurality of electronic components can be mounted on one substrate i.e., the first substrate, thereby increasing a degree of integration.

Further, according to the embodiments of the present invention, since an insulating part is formed using an insulting member, a liquid insulating material used in the related art is not required and thus a blocking part for blocking flow of the insulating material can be eliminated, thereby making the manufacturing process easier.

In addition, according to the method according to the embodiment, the insulating part is formed during the process of bonding the first substrate to the second substrate. Therefore, no additional process for forming the insulating part is required, and thus the processing time may be reduced.

While the present invention has been shown and described in connection with the embodiments, it will be apparent to those skilled in the art that modifications and variations can be made without departing from the spirit and scope of the invention as defined by the appended claims.

What is claimed is:

1. An electronic component module, comprising:
a first substrate having mounted electrodes formed on both surfaces thereof;
a plurality of electronic components mounted on both surfaces of the first substrate;
at least one second substrate bonded to a lower surface of the first substrate by soldered joints; and
an insulating part formed in at least one position in a gap between the first substrate and the second substrate and bonding the first substrate to the second substrate,
wherein the insulating part is disposed to be spaced apart from the soldered joints so as not to contact the soldered joints, and
the insulating part is a melted and cured insulating member, being one of hot-melt tape, thermal bonding tape or thermosetting bonding tape.

2. The electronic component module of claim 1, wherein the insulating part is formed along an outer edge of the gap.

3. The electronic component module of claim 1, wherein the insulating part is formed in a dashed-line shape in which multiple pieces are spaced apart.

4. The electronic component module of claim 2, wherein the insulating part further includes a secondary insulating part formed at the gap between the first substrate and the second substrate, for extending the insulating part.

5. The electronic component module of claim 1, wherein the second substrate has a through hole therein, wherein the electronic components are located in the through hole.

6. The electronic component module of claim 5, wherein the insulating part is formed along an outer edge of the through hole.

7. The electronic component module of claim 6, further comprising a secondary insulating part filling the gap between the first substrate and the second substrate and the through hole.

8. A method of manufacturing an electronic component module, the method comprising:
preparing a first substrate having mounted electrodes formed on both surfaces thereof;
mounting at least one electronic component on an upper surface of the first substrate;
disposing a solder paste and an insulating member on a lower surface of the first substrate, the insulating member disposed to be spaced apart from the solder paste so as not to contact the solder paste, and the insulating member being one of hot-melt tape, thermal bonding tape or thermosetting bonding tape;
locating at least one electronic component and at least one second substrate on the solder paste; and
forming an insulating part and soldered joints in a gap between the first substrate and second substrate by melting and curing the insulating member and the solder paste,
wherein the first substrate and the second substrate are bonded by the solder joints and the insulating part.

9. The method of claim 8, wherein the disposing of the insulating member includes:
printing a solder paste on the mounting electrodes; and
attaching the insulating member along the outer edge of the first substrate as a tape type insulating member.

10. The method of claim 8, wherein the locating of the second substrate includes locating the second substrate such that one surface of the second substrate is in contact with the insulating member.

11. The method of claim 8, further comprising, after the forming of the insulating part, forming a secondary insulating part by injecting a liquid insulating material into the gap.

12. The method of claim 8, further comprising, after the forming of the insulating part, forming a secondary insulating part by filling an insulating material in the through hole formed in the second substrate.

13. A method of manufacturing an electronic component module, the method comprising:
- preparing a first substrate in which several component-mounting regions are divided;
- mounting at least one electronic component on an upper surface of the first substrate;
- disposing a solder paste and an insulating member on a lower surface of the first substrate, the insulating member disposed in a dummy region disposed between the component-mounting regions;
- locating and mounting at least one electronic component and a second substrate on the solder paste;
- forming an insulating part by injecting a liquid insulating material between the first substrate and second substrate; and
- cutting and removing the dummy region and the insulating member to form an individual electronic component module.

14. The method of claim 13, wherein the forming of the insulating part further includes filling in the through hole formed in the second substrate with the insulating material.

* * * * *